United States Patent
Aoki

(10) Patent No.: US 6,868,020 B2
(45) Date of Patent: Mar. 15, 2005

(54) SYNCHRONOUS SEMICONDUCTOR MEMORY DEVICE HAVING A DESIRED-SPEED TEST MODE

(75) Inventor: Mamoru Aoki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/614,239

(22) Filed: Jul. 8, 2003

(65) Prior Publication Data

US 2004/0008560 A1 Jan. 15, 2004

(30) Foreign Application Priority Data

Jul. 9, 2002 (JP) .......................................... 2002-199833

(51) Int. Cl.[7] .................................................. G11C 7/00
(52) U.S. Cl. .................................. 365/200; 365/189.01
(58) Field of Search ............................ 365/200, 189.01, 365/194, 233

(56) References Cited

U.S. PATENT DOCUMENTS 6,385,104 B2 * 5/2002 Koshikawa ................. 365/201
6,385,125 B1 * 5/2002 Ooishi et al. ............... 365/233
6,536,004 B2 * 3/2003 Pierce et al. ................ 714/719

FOREIGN PATENT DOCUMENTS

| JP | 11-144497 | 5/1999 |
| JP | 11-306797 | 11/1999 |

* cited by examiner

*Primary Examiner*—Vu A. Le
(74) *Attorney, Agent, or Firm*—Young & Thompson

(57) ABSTRACT

A synchronous DRAM has a test mode wherein a specified external signal is input to a command decoder of the DRAM. The command decoder generates a plurality of internal commands including activating signal for selecting a word line, write signal, precharge signal, another activating signal and read signal at consecutive timings which do not depend on an external clock signal. A low-speed memory tester can be used for testing the high-speed synchronous DRAM.

4 Claims, 4 Drawing Sheets

SYNCHRONOUS SEMICONDUCTOR MEMORY DEVICE HAVING A DESIRED-SPEED TEST MODE

BACKGROUND OF THE INVENTION (a) Field of the Invention

The present invention relates to a synchronous semiconductor memory device having a desired-speed test mode.

(b) Description of the Related Art

A synchronous semiconductor memory device, such as a synchronous DRAM (SDRAM) device, performs a high-speed read/write operation based on a read/write command which is supplied in synchrony with an external clock signal. FIG. 3 shows a conventional SDRAM device in a block diagram. The SDRAM device includes internal clock generator 11, command decoder 12, internal address generator 13, memory cell array 14, row-decoder controller 15, row address decoder 16, column address decoder 17, sense amplifier block 18, data amplifier 19, column-decoder controller 20 and input/output (I/O) block 21.

The internal clock generator 11 receives an external clock signal CLK, to generate an internal clock signal in synchrony with the external clock signal CLK. The command decoder 12 receives external control signals including /RAS (row address strobe), /CAS (column address strobe), /WE (write enable) and /CS (chip select) signals through the control input terminals thereof, to decode the command supplied to the SDRAM, controlling the row-decoder controller 15 and the column-decoder controller 20 based on the decoded command. The symbol "/" disposed before a signal name in this text means that the corresponding signal has an active low level.

The internal address generator 13 generates internal addresses including row address (X) and column address (Y) based on the address signal ADD input through the address terminal, delivering the row address and the column address to the row address decoder 16 and the column address decoder 17, respectively. The memory cell array 14 includes an array of memory cells each storing therein data, a plurality of bit line pairs 24 each extending along the column direction of the memory cell array 14 and connected to the sense amplifier block 18, and a plurality of word lines each extending along the row direction of the memory cell array 14 and connected to the row address decoder 16.

The row-decoder controller 15 controls the row address decoder 16, and activates/inactivates the sense amplifier block 18. The row address decoder 16 selects one of word lines 25 based on the control signal supplied from the row-decoder controller 15 and the row address supplied from the internal address generator 13. The column-decoder controller 20 controls the column address decoder 17, and activates/inactivates the data amplifier 19. The column address decoder 17 selects one of the sense amplifiers in the sense amplifier block 18 based on the control signal supplied from the column-decoder controller 20 and the column address supplied from the internal address generator 13, wherein the selected sense amplifier delivers the output thereof to the data amplifier 19.

Each sense amplifier in the sense amplifier block 18 amplifies a small potential difference between a corresponding bit line pair 24 in the memory cell array 14 up to a specified level. The I/O block 11 is connected to the data amplifier 19 via a bus RWBUS, and delivers/receives read/write data DQ through data terminals.

FIG. 4 shows a timing chart of the SDRAM device of FIG. 3 in a normal operation mode. In a clock cycle C1 of the external clock signal CLK, the command decoder 12 decodes the external control signals including /RAS, /CAS, /WE and CS. It is assumed here that the decoded command is an activating command AC, which indicates selection of one of the word lines specified by the input row address.

In the SDRAM device, the activating command AC allows a signal IRASB delivered from the row-decoder controller 15 to assume a low level. The low level of signal IRASB permits the row address decoder 16 to select one of the word lines 25 corresponding to the row address (X) delivered from the internal address generator 13. The selection of the word line 25 allows the selected memory cells to deliver the own data to the sense amplifiers in the sense amplifier block 18 through the corresponding bit line pairs 24. The sense amplifiers in the sense amplifier block 18 amplify the potential differences between the respective bit line pairs 24 up to a specified level.

In a clock cycle C3, a write command WC is input to the SDRAM device, whereby signal ICASB delivered from the command decoder 12 to the column-decoder controller 20 assumes a low level. The low level of signal ICASB activates the column-decoder controller 20, which controls the column address decoder 17 to select one of the column selection lines 23 corresponding to the column address (Y) delivered from the internal address generator 13. The column selection line thus selected allows the write data DQ input through the data terminal to be stored in the selected memory cell through the I/O block 11, data amplifier 19 and sense amplifier block 18.

In a clock cycle C4, a precharge command PrC is input to the SDRAM device, whereby each of signals IRASB and ICASB assumes a high level. The high level of signal IRASB allows the selected word line 25 to be released from the selection and all the bit line pairs 24 to be equalized. In a clock cycle C6, an activating command AC is again input, the data of memory cells are read out to the bit line pairs 24, and the potential differences are amplified similarly to clock cycle C1.

In a clock cycle C8, a read command RC is input to the SDRAM, whereby signal ICASB assumes a low level. The low level of signal ICASB allows one of the column selection lines 23 to be selected. The selection of the column selection line 23 allows the data read out from the selected memory cell and amplified by the sense amplifier to be delivered to the data amplifier 19, whereby the read data DQ is output through the bus RWBUS, I/O block 21 and data terminals.

The time interval between the input of write command WC and input of precharge command PrC is defined by $t_{DPL}$ which is prescribed in the specification. Similarly, the time interval between the input of precharge command PrC and input of activating command AC is defined by $t_{RP}$, and the time interval between the input of activating command AC and the input of read command RC is defined by $t_{RCD}$, which are prescribed in the specification. A SDRAM having a higher operational speed should have smaller values for these time lengths $t_{DPL}$, $t_{RP}$ and $t_{RCD}$, and so prescribed in the specification of the SDRAM.

It is generally known that the time interval between the input of write command, read command or precharge command and the completion of the actual write-in, read-out or precharge varies from memory to memory. Thus, the products of SDRAM are subjected to a final product test by using a memory tester as to whether or not the products have a specified performance.

For example, after the precharge command PrC is input to the SDRAM device in clock cycle C4, and if the precharge itself is not completed within the time length $t_{RP}$, i.e., before clock cycle C6 at which the activating command AC is input whereby the bit line pair are not equalized, then the bit line pair cannot read out the correct data from the selected memory cell. In this respect, the memory tester supplies the precharge command at clock cycle C4 and read command at clock cycle C6, and judges pass or fail of the product based on the fact whether or not the read data coincides with the expected value.

It is to be noted that a read/write command is fed to a SDRAM device in synchrony with the external clock signal CLK and thus a high-speed memory tester generating a high-frequency external clock signal should be used for testing a high-speed SDRAM. For example, if a time length of 15 nanoseconds is prescribed for $t_{PDL}$, a memory tester having a clock cycle of around 15 nanoseconds should be used for the memory test.

However, a low-speed memory tester generating a long-cycle external clock signal is also used for testing a high-speed SDRAM in some step of the fabrication process thereof. In such a memory test using the low-speed memory tester, the interval of the inputs of commands cannot be set shorter than the clock cycle of the external clock signal, wherein the low-speed memory tester cannot test the high-speed memory device based on specifications of $t_{DPL}$, $t_{RP}$ and $t_{RCD}$ required for the memory device.

Patent Publication JP-A-11-144497 describes a technique for testing a high-speed memory device by using a low-speed memory tester. In the described technique, the commands such as activating command and precharge command are delayed by the internal circuit to reduce the time interval between these commands and the succeeding read/write command. By controlling the delays of these commands, the memory tester can test the high-speed memory device based on the specification required. In this technique, however, the total test time cannot be reduced because these commands are supplied in synchrony with the low-frequency clock signal and a specified number of commands must be supplied to the memory device for the test.

JP-A-11-306797 describes another technique for testing a high-speed memory device by using a low-speed memory tester. In this technique, an internal clock signal is obtained by doubling the frequency of the external clock signal. When a read/write command is supplied in synchrony with the rise time of the external clock signal, a specified command is generated within the memory device in synchrony with the fall time of the external clock signal, whereby the specified command is supplied in synchrony with the internal clock signal. However, in this technique, the time interval between inputs of the commands cannot be controlled, as a result of which the test cannot be performed according to the desired specification.

SUMMARY OF THE INVENTION

In view of the above problems in the conventional techniques, it is an object of the present invention to provide a semiconductor memory device which is capable of being tested based on a desired speed according to the specification substantially without increasing the time length needed for the memory test.

The present invention provides a semiconductor memory device including: a memory cell array including an array of memory cells, a plurality of bit line pairs each extending along a column of the memory cells, and a plurality of word lines each extending along a row of the memory cells; mode selection circuit for selecting either a normal operation mode or a test mode for the semiconductor memory device based on an external mode selection signal; command decoder for decoding a plurality of external commands in the normal operation mode to generate an internal control signal for each of the external commands, the internal control signal controlling operation of at least the memory cell array, the command decoder responding to a specified external signal in the test mode to generate a plurality of the internal control signals at specified consecutive timings; and a controller for controlling operation of the semiconductor memory device based on the internal control signal.

In accordance with the present invention, a plurality of the internal control signals delivered from the command decoder in the test mode allow a low-speed memory tester to test the semiconductor memory device of the present invention at a desired high speed without depending on the clock signal delivered from the memory tester.

The above and other objects, features and advantages of the present invention will be more apparent from the following description, referring to the accompanying drawings.

PREFERRED EMBODIMENT OF THE INVENTION

Figure 1:
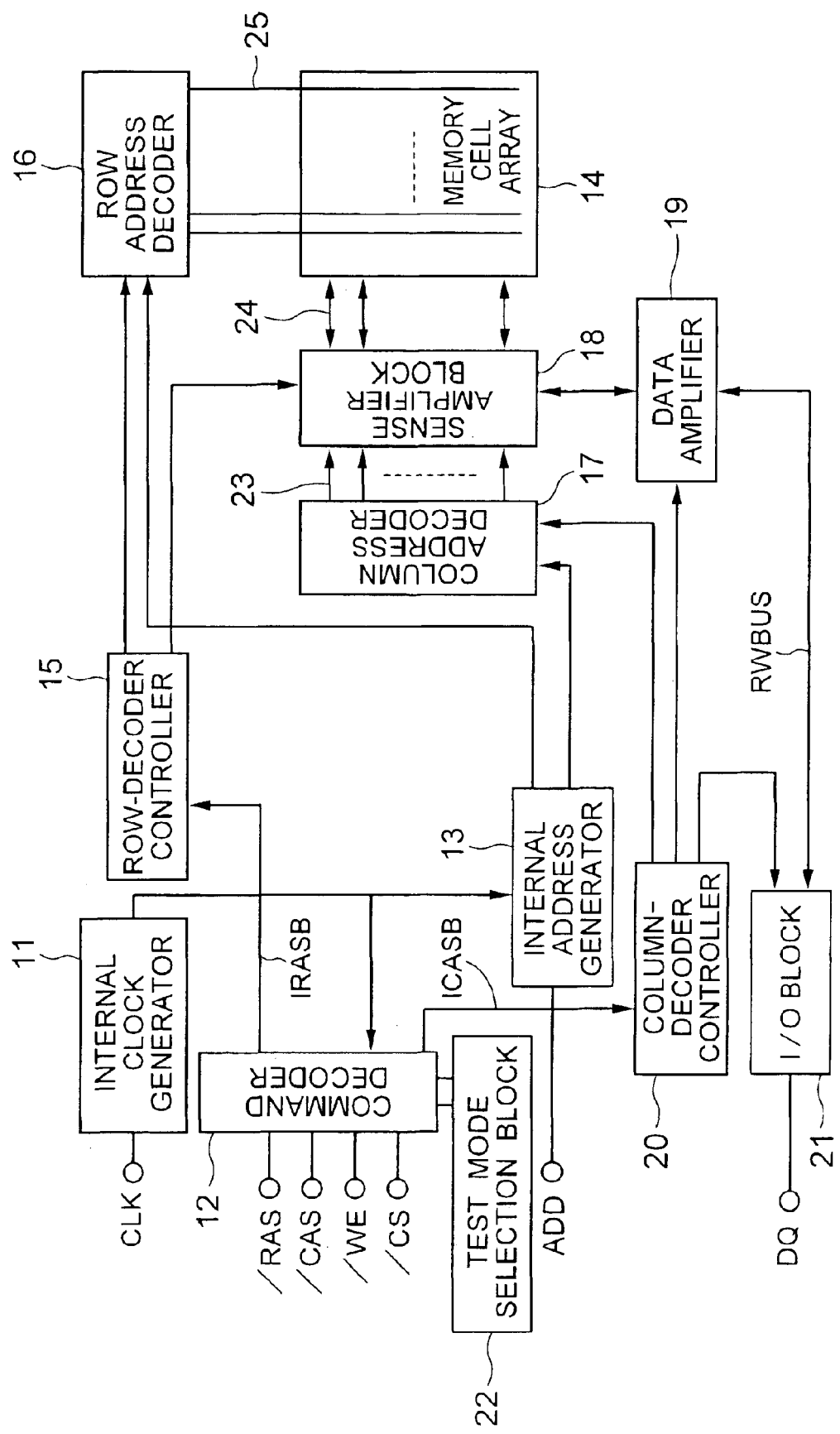
FIG. 1 is a block diagram of a semiconductor memory device according to an embodiment of the present invention.

Now, the present invention is more specifically described with reference to accompanying drawings, wherein similar constituent elements are designated by similar reference numerals throughout the drawings.

Referring to FIG. 1, a semiconductor memory device according to an embodiment of the present invention is implemented as a SDRAM. Basically, the SDRAM of the present embodiment is different from the conventional SDRAM in that the SDRAM of the present embodiment includes a test mode selection block (mode selection circuit) 22 and performs a different operation during a test mode, as will be detailed hereinafter.

The SDRAM device of the present embodiment includes internal clock generator 11, command decoder 12, internal address generator 13, memory cell array 14, row-decoder controller 15, row address decoder 16, column address decoder 17, sense amplifier block 18, data amplifier 19, column-decoder controller 20, input/output (I/O) block 21, and test mode selection block 22.

The internal clock generator 11 receives an external clock signal CLK, to generate an internal clock signal in synchrony with the external clock signal CLK. The command decoder 12 receives external control signals including /RAS (row address strobe), /CAS (column address strobe), /WE (write enable) and /CS (chip select) signals at the control input terminals thereof, to decode the command supplied to the SDRAM, thereby controlling the row-decoder controller 15 and the column-decoder controller 20.

The test mode selection block 22 judges whether or not the external control signals input to the SDRAM correspond to a test mode entry command which allows the SDRAM to enter a test mode thereof. For example, the test mode entry command is implemented by a combination of external control signals including /RAS, /CAS, /WE and /CS and an address signal. The test mode entry command is generally supplied to the SDRAM to test the SDRAM in the final product test or the performance evaluation test, and thus not used in a normal operation mode. The test mode selection block 22 allows the command decoder 12 to enter a test mode if the test mode selection block 22 detects a test mode entry command.

The internal address generator 13 generates internal addresses including row address (X) and column address (Y) based on the address signal ADD input through the address terminal, delivering the row address and the column address to the row address decoder 16 and the column address decoder 17, respectively. The memory cell array 14 includes an array of memory cells each storing therein data, a plurality of bit line pairs 24 each extending along the column direction of the memory cell array 14 and connected to the sense amplifier block 18, and a plurality of word lines each extending along the row direction of the memory cell array 14 and connected to the row address decoder 16.

The row-decoder controller 15 controls the row address decoder 16, and activates/inactivates the sense amplifier block 18. The row address decoder 16 selects one of word lines 25 based on the control signal supplied from the row-decoder controller 15 and the row address supplied from the internal address generator 13. The column-decoder controller 20 controls the column address decoder 17, and activates/inactivates the data amplifier 19. The column address decoder 17 selects one of the sense amplifiers in the sense amplifier block 18 based on the control signal supplied from the column-decoder controller 20 and the column address supplied from the internal address generator 13, wherein the selected sense amplifier delivers the output thereof to the data amplifier 19.

Each sense amplifier in the sense amplifier block 18 amplifies a small potential difference between a corresponding bit line pair 24 in the memory cell array 14 up to a specified level. The I/O block 11 is connected to the data amplifier 19 via a bus RWBUS, and delivers/receives read/write data DQ through data terminals.

Figure 2:
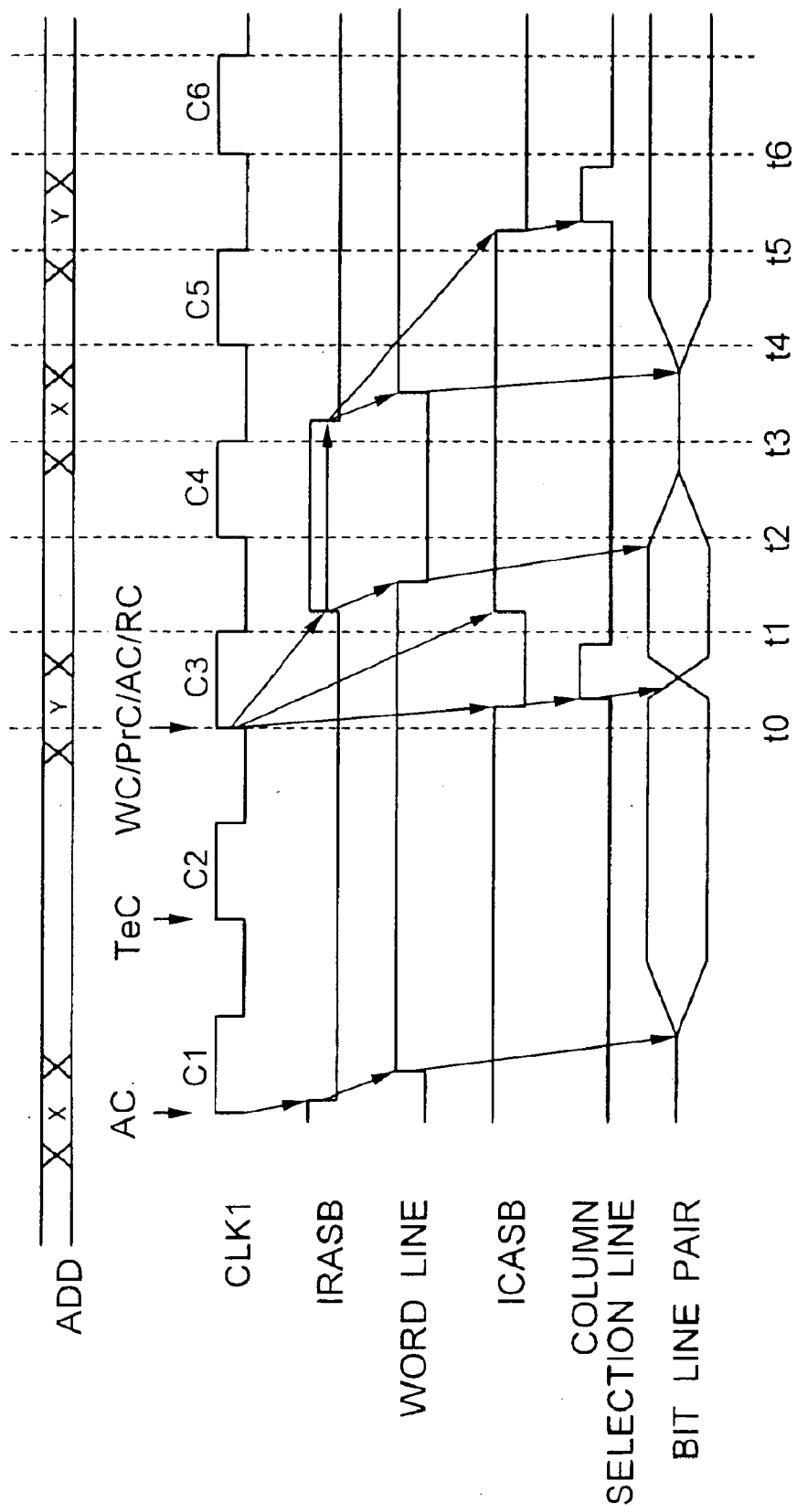
FIG. 2 is a timing chart of the semiconductor memory device of FIG. 1.
Figure 3:
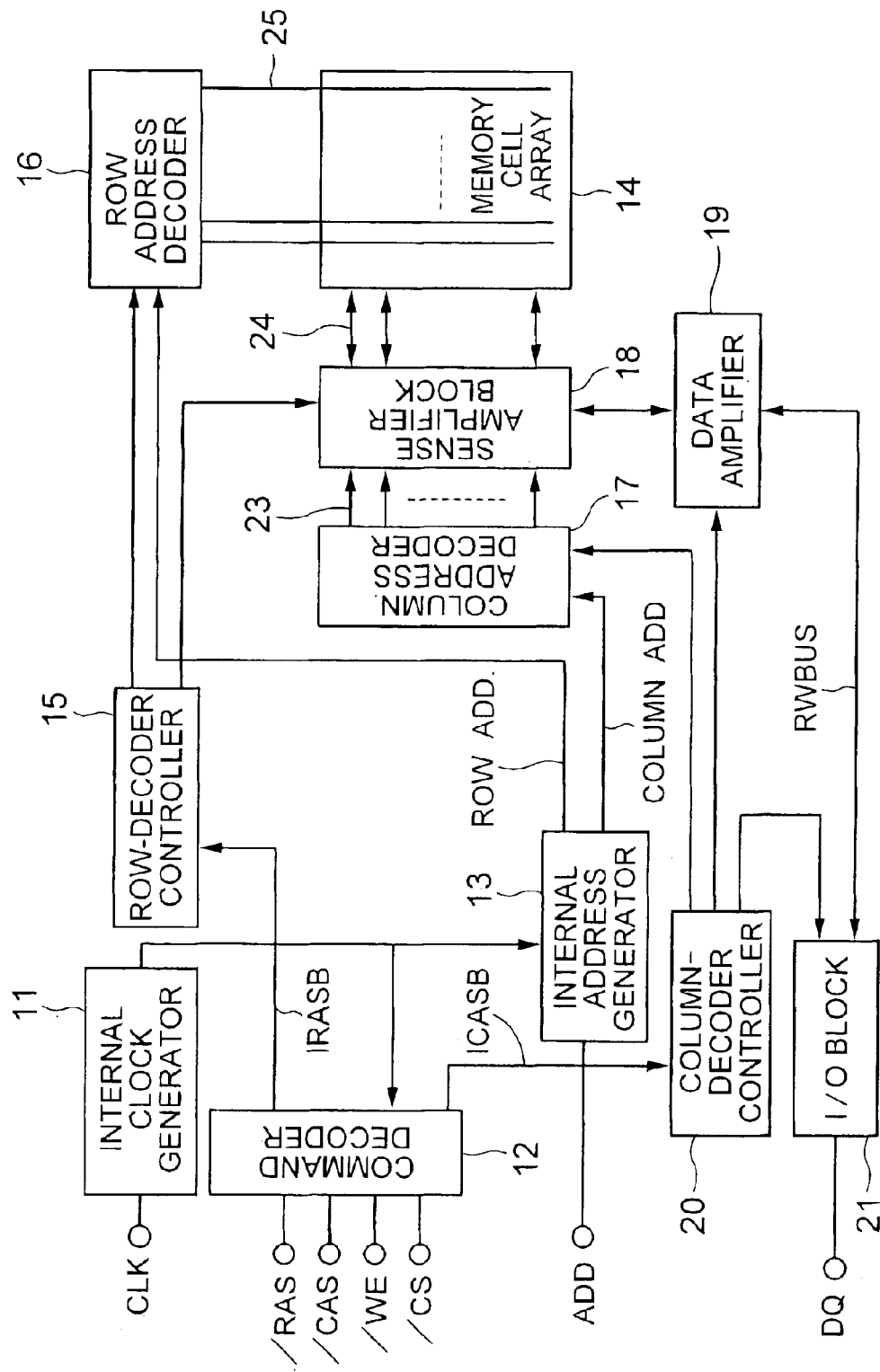
FIG. 3 is a block diagram of a conventional semiconductor memory device.
Figure 4:
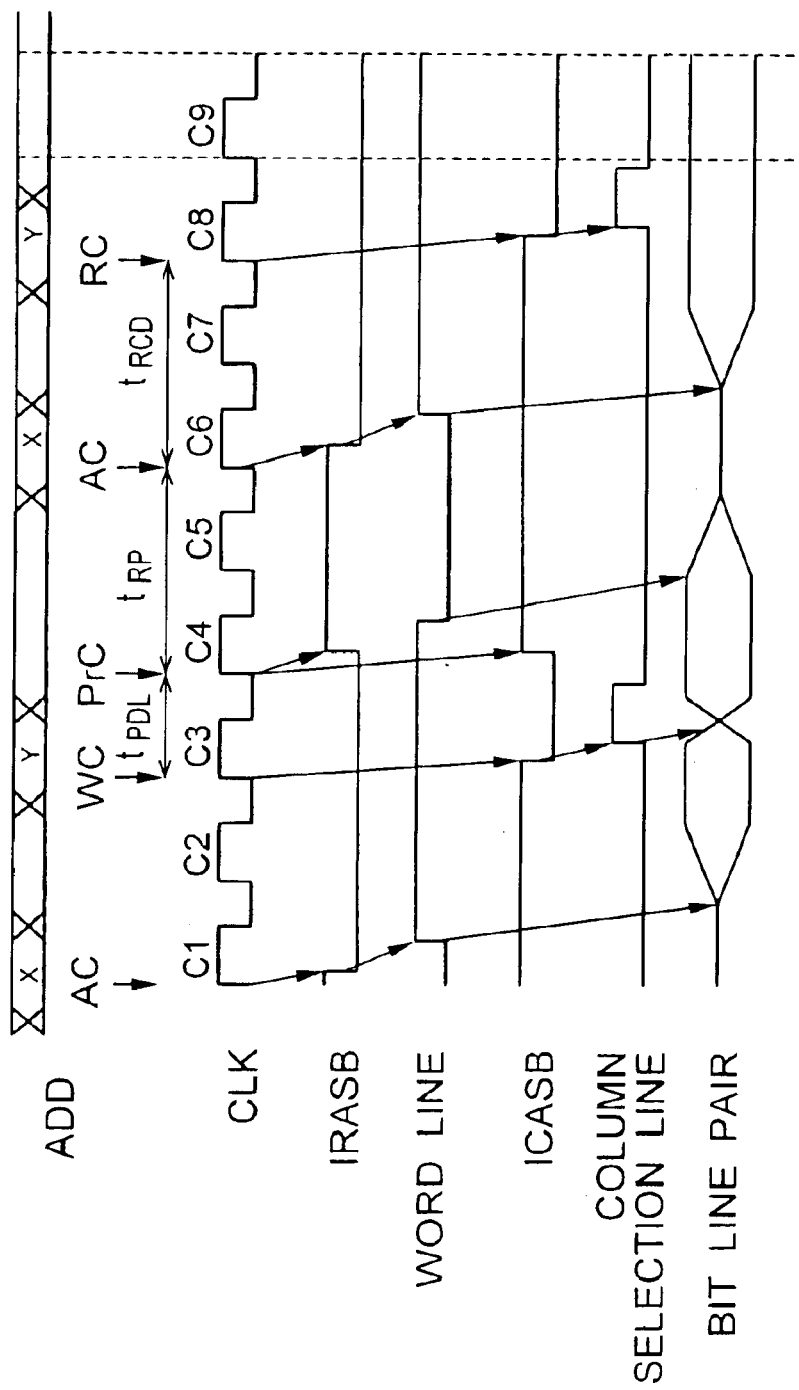
FIG. 4 is a timing chart of the semiconductor memory device of FIG. 3.

Referring to FIG. 2, there is shown a timing chart of the SDRAM device of FIG. 1 during a test mode. It is to be noted that the external clock signal CLK1 used in the test mode shown in FIG. 2 has a lower frequency, i.e., longer clock period, than the external clock signal CLK shown in FIG. 4. In this example, the external clock signal CLK1 has a double clock period compared to the clock period of the external clock signal CLK in the normal operation mode.

In a clock cycle C1 of the external clock signal CLK1, the command decoder 12 decodes the control signals including /RAS, /CAS, /WE and CS. If the decoded command is an activating command AC which indicates selection of the word line specified by the input row address, the activating command AC allows a signal IRASB delivered to the row-decoder controller 15 to assume a low level. The low level of signal IRASB allows the row-decoder controller 15 to activate the row address decoder 16 and the sense amplifier block 18.

The row address decoder 16 selects one of the word lines 25 corresponding to the row address (X) delivered from the internal address generator 13. The selection of the word line 25 allows the memory cells connected to the selected word line 25 to deliver the own data to the respective sense amplifiers in the sense amplifier block 18 through the respective bit line pairs 24. The sense amplifiers in the sense amplifier block 18 amplify the potential differences between the respective bit line pairs 24 up to a specified level.

In a clock cycle C2, a test mode entry command TeC is input to the SDRAM device, whereby the test mode selection block 22 sets a test mode to the command decoder 12. In a clock cycle C3, after a write command WC is input to the SDRAM device, the command decoder 12 decodes the write command, thereby indicating the row-decoder controller 15 and the column-decoder controller 20 to perform processings similar to the processings upon consecutive inputs of the write command, precharge command, activating command and read command in synchrony with the external clock signal CLK during a normal operation mode, as will be detailed hereinafter.

Assuming that the write command is input to the SDRAM device at time instant t0 in the test mode, the command decoder 12 lowers the level of signal ICASB input to the column-decoder controller 20 at time instant t0 (more correctly, immediately after t0), similarly to the case of input of write command at t0 during a normal operation mode. The low level of signal ICASB allows the column-decoder controller 20 to activate the column address decoder 17. The column address decoder 17 selects one of the column selection lines 23 corresponding to the column address supplied from the internal address generator 13. The selection of the column selection line 23 allows the write data DQ to be delivered to the selected memory cell via the data terminals, I/O block 21, data amplifier 19 and sense amplifier in the sense amplifier block 18, thereby storing the write data in the selected memory cell.

The command decoder 12 raises the level of signals IRASB and ICASB to a high level at a timing similarly to the case of input of a precharge command to the command decoder 12 at t1 during a normal operation mode. This timing may be implemented by using a delay circuit. It is to be noted that t0 is a time instant at which a half period of the external clock signal CLK1 is elapsed since time instant t0. Upon the rise of signal IRASB to a high level, the selected word line 25 is released from the selection and the bit line pairs 24 are equalized to a specified potential.

The command decoder 12 maintains the high level of signal IRASB for a specified time length, and lowers the level of signal IRASB at a timing similar to the case of input of an activating command at t3. The low level of signal IRASB allows the selected word line 25 to assume a high level similarly to the clock cycle C1, whereby the data stored in the memory cells connected to the selected word line 25 are read to the bit line pairs 24. The sense amplifiers amplify the potential differences between the respective bit line pairs 24 to a specified level.

The command decoder 12 maintains the high level of signal ICASB for a specified time length, and lowers signal ICASB to a low level at a timing similar to the case of input a read command at t5. The low level of signal ICASB allows one of the column selection lines 23 to be selected, whereby the data obtained by the sense amplifier amplifying the potential difference between the selected bit line pair 24 is delivered to the data amplifier 19, which delivers the amplified data DQ through bus RWBUS, I/O block and data terminals.

In the present embodiment, after the test mode entry command is input to the SDRAM device for entering the test mode, the write command is input in synchrony with the external clock signal. The command decoder 12, after decoding the write command in the test mode, delivers control signals to the row-decoder controller 15 and column-decoder controller 20 without depending on the timing of the external clock signal CLK1. The control signals delivered herein are such that the write command, precharge command, activating command, and read command input in this order will generate.

More specifically, signal ICASB is first lowered to a low level corresponding to the write command, signals ICASB and IRASB are raised to a high level after a specified time length, i.e., immediately after t1, signal IRASB is lowered immediately after t3 after maintaining the high level for a specified time length, and signal ICASB is lowered immediately after t5 after maintaining the high level for a specified time length. The memory tester, after delivering the write command, writes data at a timing matched with the timing of storing data in the SRAM device, and reads data at a timing matched with the timing of reading data from the SDRAM device.

In a preferred embodiment, the command decoder 12 includes delay circuits which deliver control signals similar to the control signals delivered in the case of a plurality of commands being consecutively input to the SDRAM device. This allows a low-speed memory tester can test a high-speed SDRAM. It is to be noted that the time length needed for writing/reading data in/from the SDRAM after the write command WC is input to the SDRAM does not depend on the external clock signal CLK1 and equals the time length needed for the normal operation. This allows a low-speed memory tester to perform a high-speed test for a high-speed SDRAM device. The delay times of the delay circuits used for generating the timings should be determined based on $t_{DPL}$, $t_{RP}$ and $t_{RCD}$ specified in the specification. This allows a single memory tester to test a plurality of memory devices having different time performances.

It is to be noted that the input of the write command to the SDRAM device and the order of write command, precharge command, activating command and read command in the subsequent test employed in the above embodiment are only examples, and may be modified as desired. The time interval between two of the above commands may be determined as desired without depending on the clock cycle of the external clock signal.

Since the above embodiments are described only for examples, the present invention is not limited to the above embodiments and various modifications or alterations can be easily made therefrom by those skilled in the art without departing from the scope of the present invention.

What is claimed is:

1. A semiconductor memory device comprising:
   a memory cell array including an array of memory cells, a plurality of bit line pairs each extending along a column of said memory cells, and a plurality of word lines each extending along a row of said memory cells;
   a mode selection circuit for selecting either a normal operation mode or a test mode for said semiconductor memory device based on an external mode selection signal;
   a command decoder for decoding a plurality of external commands in said normal operation mode to generate an internal control signal for each of said external commands, said internal control signal controlling operation of at least said memory cell array, said command decoder responding to a specified external signal in said test mode to generate a plurality of said internal control signals at specified consecutive timings; and
   a controller for controlling operation of said semiconductor memory device based on said internal control signal,
   wherein said plurality of internal control signals include an internal write signal for controlling a timing of inputting writer data to one of said bit line pairs, an internal precharge signal for controlling a timing of precharging said bit line pairs, and an internal activating signal controlling a timing of selecting one of said word lines.

2. The semiconductor memory device according to claim 1, wherein said plurality of internal control signals further include an internal read signal following said internal activating signal, said internal read signal controlling a timing of reading data from said one of said bit line pairs.

3. The semiconductor memory device according to claim 2, wherein said plurality of internal control signals further include another internal activating signal prior to said internal write signal, said another internal activating signal controlling a timing of selecting one of said word lines.

4. A semiconductor memory device comprising:
   a memory cell array including an array of memory cells, a plurality of bit line pairs each extending along a column of said memory cells, and a plurality of word lines each extending along a row of said memory cells;
   a mode selection circuit for selecting either a normal operation mode or a test mode for said semiconductor memory device based on an external mode selection signal;
   a command decoder for decoding a plurality of external commands in said normal operation mode to generate an internal control signal for each of said external commands, said internal control signal controlling operation of at least said memory cell array, said command decoder responding to a specified external signal in said test mode to generate a plurality of said internal control signals at specified consecutive timings; and
   a controller for controlling operation of said semiconductor memory device based on said internal control signal,
   wherein said command decoder includes delay circuits for controlling said timings of said plurality of internal control signals.

* * * * *